United States Patent [19]

Inoue et al.

[11] Patent Number: 5,000,988
[45] Date of Patent: Mar. 19, 1991

[54] METHOD OF APPLYING A COATING OF VISCOUS MATERIALS

[75] Inventors: Takao Inoue; Tetsuo Fukushima; Kenji Fukumoto, all of Hirakata; Kazumi Ishimoto, Katano, all of Japan

[73] Assignee: Matsushita Electric Industrial Co., Ltd., Osaka, Japan

[21] Appl. No.: 143,027

[22] Filed: Jan. 12, 1988

[30] Foreign Application Priority Data

Jan. 14, 1987 [JP] Japan .................................. 62-6616

[51] Int. Cl.⁵ .............................................. B05D 5/12
[52] U.S. Cl. .................................... 427/286; 427/99
[58] Field of Search ............... 118/680, 411, 412, 415, 118/679; 427/286, 8, 96

[56] References Cited

U.S. PATENT DOCUMENTS

| 4,267,204 | 5/1981 | Tomita et al. ................... 427/8 X |
| 4,291,642 | 9/1981 | Kolc ................................ 118/680 X |
| 4,324,816 | 4/1982 | Landis et al. ................... 118/411 X |
| 4,476,165 | 10/1984 | McIntyre ....................... 118/411 X |
| 4,743,465 | 5/1988 | Saeki et al. .................... 118/411 X |
| 4,938,994 | 7/1990 | Choinski ............................ 427/96 |

FOREIGN PATENT DOCUMENTS 60-69634 4/1985 Japan .
60-119526 7/1985 Japan .
60-179722 11/1985 Japan .

Primary Examiner—Evan Lawrence
Attorney, Agent, or Firm—Wenderoth, Lind & Ponack

[57] ABSTRACT

In the coating method of a viscous material according to the present invention, a nozzle body having outlets corresponding to many coating rows is employed. The nozzle body is moved, while the gap between the nozzle body and the surface to be coated is maintained constant, so that the viscous material composed of different kinds of materials is discharged out of each outlet, thereby to effect simultaneous coating of the viscous material composed of different kinds of materials in many rows. Therefore, the present invention has such advantages that the surface to be coated is less stained, and at the same time, the surface to be coated becomes more smooth.

28 Claims, 5 Drawing Sheets

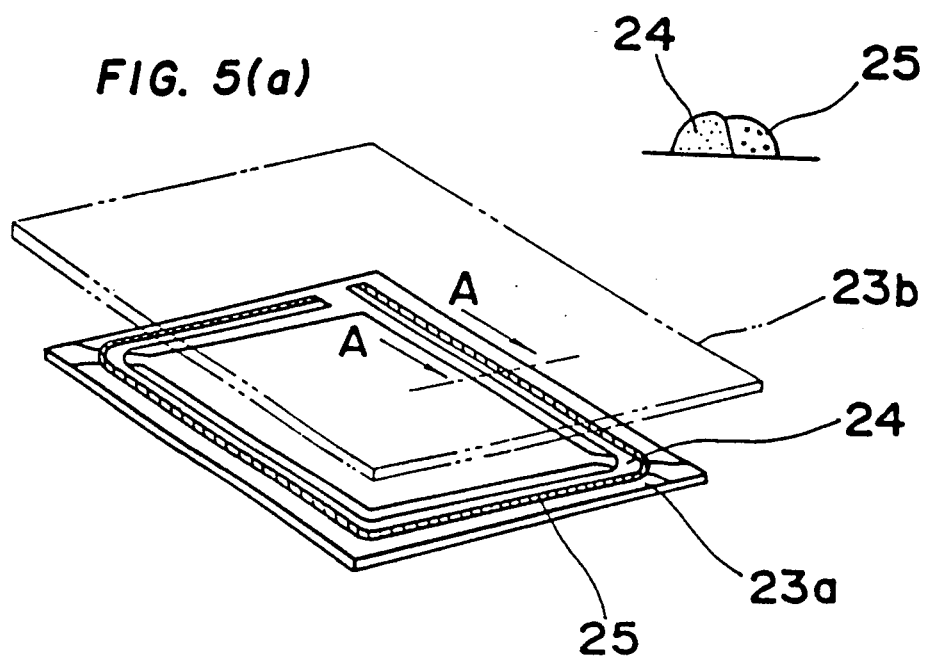
FIG. 5(a)
FIG. 5(b)
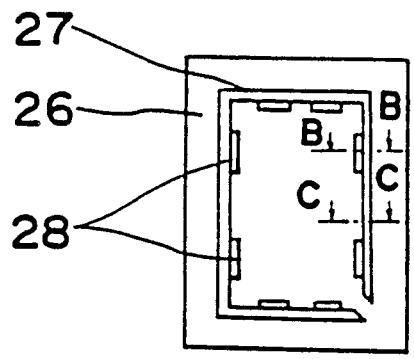
FIG. 6(a)
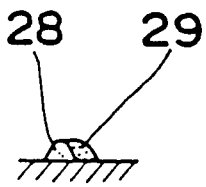
FIG. 6(b)
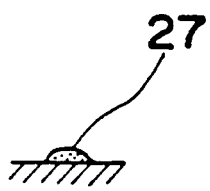
FIG. 6(c)
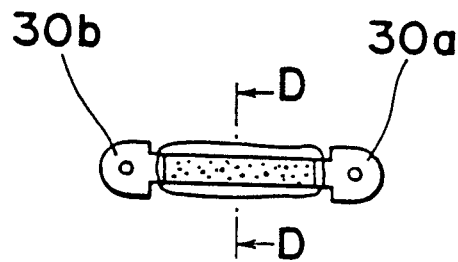
FIG. 7(a)
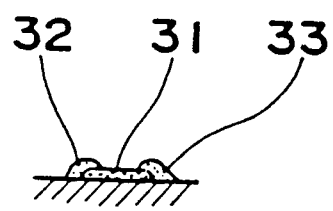
FIG. 7(b)

METHOD OF APPLYING A COATING OF VISCOUS MATERIALS

BACKGROUND OF THE INVENTION

1. Field of the Invention

The present invention relates to a method for applying a viscous material such as a sealing agent to a for liquid crystal panel, or for applying a resistance material, conductive paste, and the like to a printed wiring circuit.

2. Description of the Prior Art

Conventionally, a printed circuit has been formed using methods of photogravure printing, screen printing, etc. In rare cases, a partial circuit has been formed on a substrate by the employment of a dispenser. However, when a coating is applied in a thickness of microns, particularly, in the case of printing a liquid crystal or the like, adhesion of dust to the film has to always be taken into consideration.

FIGS. 11, 12(a) and 12(b) are views of conventional coating methods. FIG. 11 shows the screen printing, method wherein an application material or a coating material (59) is placed on a screen (57) having a predetermined pattern formed thereon, and a squeegee (56) is moved in a direction shown by an arrow, so that the object (58) is coated with a film (61).

When both a thermohardening resinous adhesive agent and an ultra-violet ray hardening adhesive agent are used together as a sealant for a liquid crystal panel, or when a resistance member and an insulative member are simultaneously formed on a circuit board, it is required that the two kinds of viscous materials be coated without any interval therebetween. In such cases as described above, however, an earlier-coated film should be hardened or sintered before a second film is applied by the screen printing method in order to avoid stains of the earlier-coated film resulting from contact with the screen. Therefore, in the conventional screen printing method the number of processes including the hardening process and the sintering process cannot be sufficiently reduced.

Furthermore, the screen printing method has drawbacks, in that not only is dust adhered to the surface of the screen, but traces of mesh are marked on the surface of the printed film because of repeated use of the screen. Therefore, it has been difficult to achieve a coating of a uniform thickness and a smooth surface using the screen printing method.

On the other hand, FIGS. 12(a) and 12(b) shows a conventional coating method which uses a dispenser. After a substrate (64) is coated with a coating material (63) through a nozzle (62) as shown in FIG. 12(a), the surface is further coated with a coating material (66) by a different dispenser. (65) as shown in FIG. 12(b). Therefore, this method represented in FIGS. 12(a) and 12(b) requires twice the coating processes. In addition, in the above-described dispenser coating method, the nozzle may come into contact with the substrate during the second coating process, resulting in the need for a high degree of positioning accuracy.

It is known to be desirable that the preferable mode of applying sealing agents to a liquid crystal is for the sealing agents which have their own characteristic functions to be coated in many rows such as the double-structured sealing agent disclosed in Japanese Patent Laid-open Publication Tokkaisho No. 60-69634 (69634/1985), from the viewpoint of the affinity with the liquid crystal, ratio of humid permability, etc. However, when a dispenser is used for applying the coating of the sealing agents as disclosed in Japanese Patent Laid-open Publication Tokkaisho No. 60-179722 (179722/1985), the earlier-coated sealing agent usually comes into contact with the dispenser, because the coating process is carried out twice, resulting in an insufficient sealing structure of the liquid crystal. Further, when the present inventors tried to form a temporary hardening sealing agent by the use of the dispenser after coating of the sealing agent as disclosed in Japanese Patent Laid-open Publication Tokkaisho No. 60-119526 (119526/1985), they found it difficult to adjust the position of the temporary hardening agent with that of the earlier-coated sealing agent. Moreover, they also found it difficult to coat the temporary hardening agent at the same distance from the substrate as that of the earlier-coated agent.

SUMMARY OF THE INVENTION

Accordingly, an essential object of the present invention is to provide an improved coating method for coating a substrate with a viscous material continuously and simultaneously in many rows.

A further object of the present invention is to provide an improved coating method for coating a substrate with a viscous material simultaneously in many rows continuously and intermittently.

A still further object of the present invention is to provide an improved coating method for coating a substrate with a viscous material simultaneously in different, thicknesses and in many rows.

More specifically, according to the first embodiment of the present invention, a nozzle body (hereinafter referred to as "nozzle") provided with outlets corresponding to many coating rows is moved above the substrate, with the gap between the nozzle and the surface to be coated being maintained constant, so that the viscous material is sent out of each outlet continuously and simultaneously.

According to the second embodiment of the present invention, a nozzle having outlets corresponding to many coating rows is moved above the substrate, with the gap between the nozzle and the surface to be coated being maintained constant, so that the viscous material is discharged out of at least more than one outlet continuously, and the viscous material is discharged out of at least more than one outlet intermittently.

According to the third embodiment of the present invention, a nozzle having outlets corresponding to many coating rows, at least one of which outlets has a different gap from the surface to be coated, is moved above the substrate with the gap between the nozzle and the surface to be coated being maintained constant, so that the viscous material is discharged out of all the outlets continuously and simultaneously, or the viscous material is discharged out of at least more than one outlet intermittently.

For controlling the uniform thickness of the coating film, a gap member which is integrally formed with the nozzle and capable of sliding on a surface in the vicinity of the surface to be coated can be used to maintain a constant distance between the nozzle and the surface to be coated. Or, in the case of a substrate which is easily flawed or when an aluminum electrode is present in the substrate, the shape of the surface to be coated is detected by light, which information is fed back to a driving part holding the nozzle, so that the gap between the nozzle and the surface to be coated can be held at a predetermined distance. Moreover, the material to be discharged out of each of the outlets may be different from each other.

It is noted that a temperature adjustable nozzle is most preferable since the viscous material can be discharged from the nozzle after the temperature of the material has been adjusted in such nozzle while maintaining a constant distance from the substrate. Further, an object to be coated may be favorably of such construction that it can be temperature-adjusted through an adhesion plate.

As described above, according to the first embodiment of the invention, since the coating material is discharged simultaneously through outlets which are the same distance from the surface to be coated, an approaching outlet is never brought into touch with the surface to be coated after the previous outlet has passed, thereby enabling stable coating of the viscous material to be applied to the substrate in a plurality of rows at a uniform height.

According to the second embodiment of the present invention, since the coating material can be dispensed in a combined manner of continuous discharging and discontinuous discharging, the line width can be varied. Therefore, when the sealing agent which is necessary to be tough in adhesive force is to be coated, the width of lines of a part which is required to be strongly adhesive can be made wide. On the other hand, when the resistance paste is to be applied, the resistance value of the paste can be variably controlled by changing the coating width of the paste.

According to the third embodiment of the present invention, it is possible to coat a viscous material in many rows and with different thicknesses. Therefore, if a conductive paste is coated low and an insulative paste is coated high continuously to be sintered, a wiring that is free from contacts between lines can be obtained.

In the first, second and third embodiment of the present invention, the coating material is discharged simultaneously from more than one outlet, and accordingly, not only is the positional relationship between mutual rows kept uniform, but the film thickness can be definitely controlled at the coating time. Moreover, it is advantageous that the coating material need not be repeatedly coated, in contrast to the screen printing method in addition to leaving no trace of printing. In addition, the rows of coating material adhere to each other around the outlets to coat the object, so that the object can be coated with the coating material without interval between rows.

BRIEF DESCRIPTION OF THE DRAWINGS

These and other objects and features of the present invention will become apparent from the following description taken in conjunction with preferred embodiments thereof with reference to the accompanying drawings, in which:

FIG. 5(a) is a plan view showing the coating state;

FIG. 5(b) is a cross sectional view of the part A of FIG. 5(a);

FIG. 6(a) is a plan view showing another coating state;

FIG. 6(b) is a cross sectional view of the part B of FIG. 6(a);

FIG. 6(c) is a cross sectional view of the part C of FIG. 6(a);

FIG. 7(a) is a plan view showing a coating state different from those in FIGS. 5(a) and 6(a);

FIG. 7(b) is a cross sectional view of the part B of FIG. 7(a);

DETAILED DESCRIPTION OF THE INVENTION

Figure 1A:
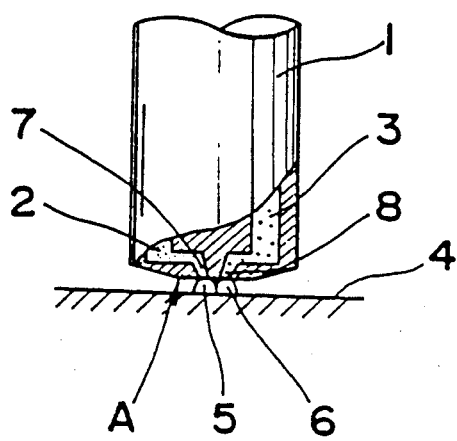
FIG. 1(a) is a partial sectional front elevational view of a nozzle employed in the first embodiment according to the present invention.

Before the description of the present invention proceeds, it is noted that like parts of the invention are designated by like reference numerals throughout the accompanying drawings.

FIGS. 1-4 show the shape of a nozzle required for practicing the present invention. It is noted that the description of the present invention hereinbelow will be related to the application of a sealing agent to a liquid crystal panel.

Figure 1B:
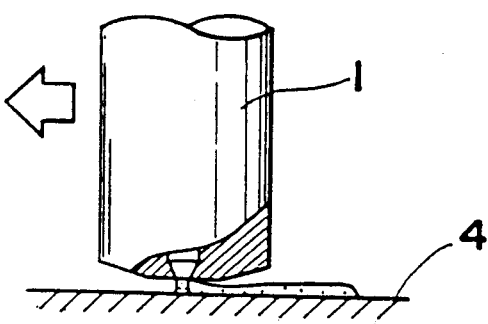
FIG. 1(b) is a partial sectional side elevational view of the nozzle of FIG. 1(a)
Figure 2:
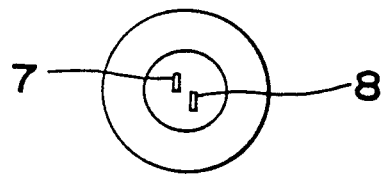
FIG. 2 is a bottom view of the nozzle of FIG. 1.

Referring to FIGS. 1(a) and 1(b), there are shown respectively a front elevational view and a side elevational view of a nozzle 1 employed for simultaneously coating a surface with two rows of viscous material. The nozzle 1 is comprised of tanks 2 and 3 respectively containing a first epoxy liquid 5 and an ultra-violet ray hardening material 6, which materials are dispensed through their respective outlets 7 and 8. While air pressure is added to the both tanks 2 and 3, the nozzle 1 is advanced to obtain the coating in two rows simultaneously. The coating of the material becomes beautiful by arranging the length of the outlet slit and the amount of air pressure in the tanks.

Figure 3A:
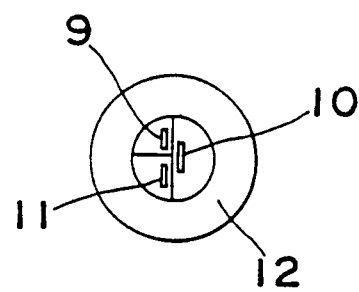
FIG. 3(a) is a bottom view of a nozzle employed in the second embodiment of the present invention.
Figure 3B:
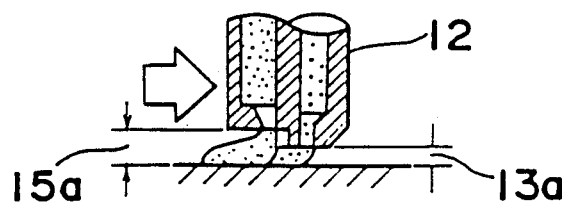
FIG. 3(b) is a side sectional view of the nozzle of FIG. 3(a)
Figure 3C:
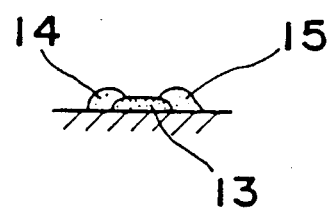
FIG. 3(c) is a sectional view of a coating material employed in the second embodiment of the present invention.

In FIG. 3, and particularly FIG. 3(c), there is shown a coating method wherein insulative films 14 and 15 are applied at greater thicknesses than the conductive paste 13. FIG. 3(a) is a bottom; view of a nozzle 12 seen from the side of the outlet, and FIG. 3(b) is a side sectional view of the nozzle 12. The nozzle 12 has an outlet 10 for dispensing the conductive paste having a smaller gap 13a from the object to be coated and outlets 9 and 11 for dispensing the insulative films having a larger gap 15a than the gap 13a. When the nozzle is moved in the direction shown by the arrow in FIG. 3(b) while discharging the coating material, such coating film is simultaneously formed on the substrate in a plurality of rows as shown in FIG. 3(c).

Figure 4A:
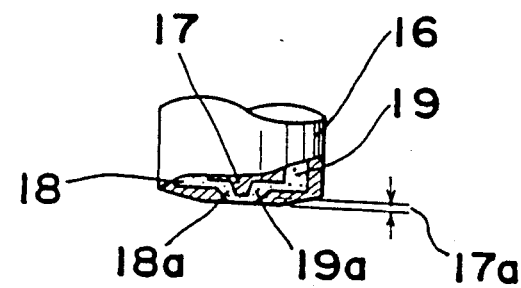
FIG. 4(a) is a partial sectional front elevational view of a nozzle employed in the third embodiment of the present invention.
Figure 4B:
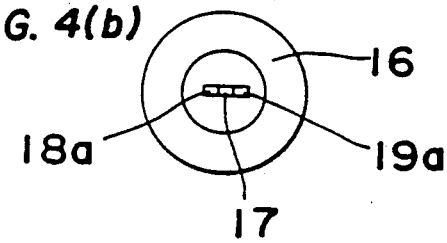
FIG. 4(b) is a bottom view of the nozzle of FIG. 4(a)
Figure 4C:
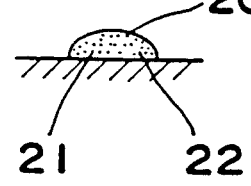
FIG. 4(c) is a sectional view of a coating material employed in the third embodiment of the present invention.

FIG. 4 shows a nozzle 16 by which the upper surface of a portion where different kinds of coating materials are mixed is rendered less rough. The nozzle 16 includes a tank 18 for the first epoxy liquid 21 and a tank 19 for the ultra-violet ray hardening material 22. The respective outlets 18a and 19a of the tanks 18 and 19 are formed on the same line, and a separator 17 between the outlets 18a and 19a is so arranged as to have a step difference 17a from the tip end of the outlets. When coating is performed through the nozzle 16, the epoxy liquid and the ultra-violet ray hardening material are sufficiently adhered to each other before they are coated, so that an upper surface 20 of the coating film is formed smooth as if the epoxy liquid and the ultra-violet ray hardening material were discharged through one outlet.

FIG. 5(a) represents an example of an embodiment when a color filter 23a of the liquid crystal panel is coated simultaneously with an epoxy 24 and an violet ray hardening sealing agent 25 using the nozzle shown in FIG. 1. FIG. 5(b) is a cross sectional view along line A of FIG. 5(a). After each of the above-described sealing agents 24 and 25 is coated, the color filter 23a is adhered to a liquid crystal panel 23b thereby completing a liquid crystal panel.

In FIG. 6(a), there is shown an example when a color filter 26 of a liquid crystal panel is coated with an epoxy liquid 27 through continuous coating and also with an ultra-violet ray hardening sealing agent 28 through discontinuous coating. FIGS. 6(b) and 6(c) are cross sectional views of the coated portion along lines B and C of FIG. 6(a), respectively.

Meanwhile, FIG. 7(a) shows an example where a resistance member 31 and insulative films 32 and 33 are simultaneously coated between electrode lands 30a and 30b. The cross-sectional view along line D of FIG. 7(a) is shown in FIG. 7(b).

Figure 8A:
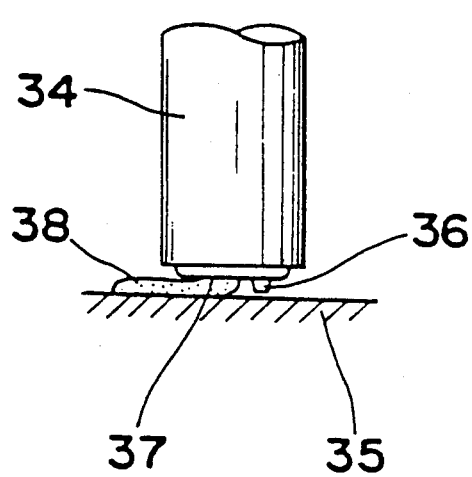
FIG. 8(a) is a side elevational view representing one example of forming a gap.
Figure 8B:
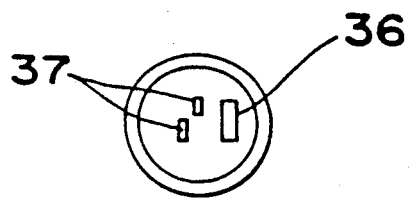
FIG. 8(b) is a bottom view of FIG. 8(a)
Figure 9:
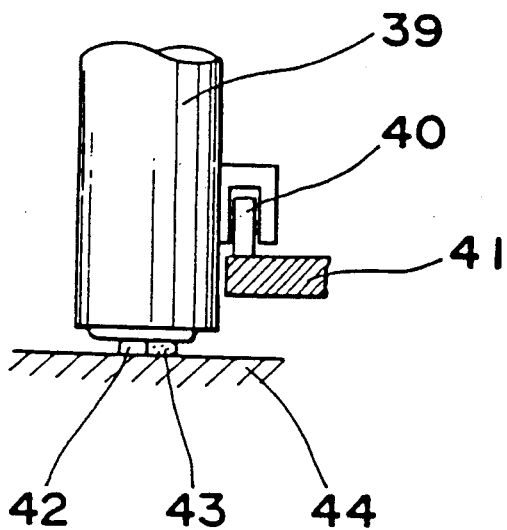
FIG. 9 is a front elevational view representing another example of forming a gap.

Referring to FIGS. 8 and 9, an example of a method of maintaining a gap between the object to be coated and the nozzle outlet is illustrated therein. In FIG. 8, the gap is formed by an object to be coated 35, a nozzle 34, an outlet 37, a coating material 38 and a gap column 36. The gap is maintained in the manner that the gap column 36 at the front end of the nozzle 34 slides on the upper surface of the object to be coated 35. FIG. 9 represents the case where a nozzle 39 is so arranged as not to be in touch with an object to be coated 44 when the object 44 has an Al electrode or the like. A roller 40 at the side of the nozzle slides on a side reference plate 41 thereby to maintain the gap between the nozzle 39 and the object to be coated 44. As a result, the nozzle never comes into touch with the object to be coated even when the object is coated with two kinds of materials 42 and 43 in two rows.

Figure 10:
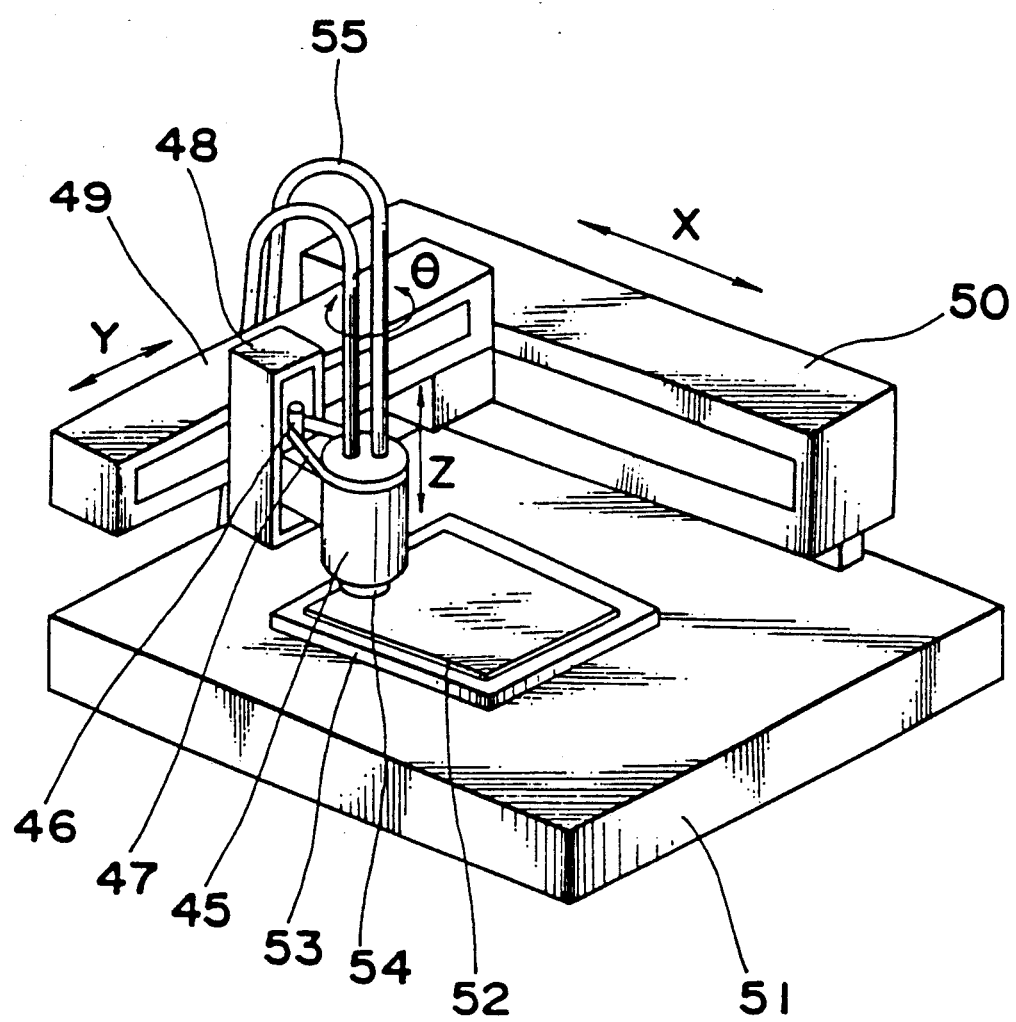
FIG. 10 is a perspective view schematically showing the construction of a coating machine.
Figure 11:
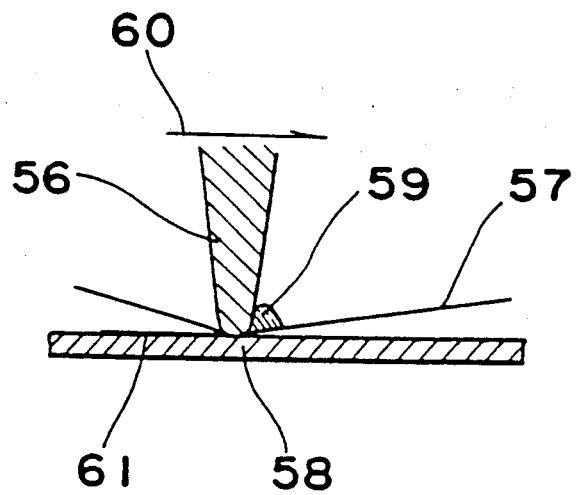
FIG. 11 is an explanatory view of a conventional screen printing method.
Figure 12A:
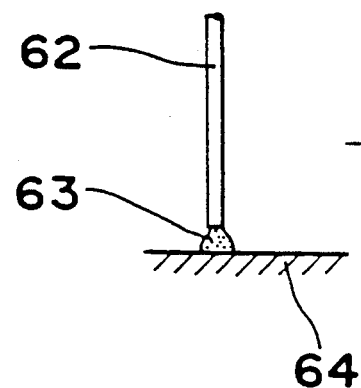
FIGS. 12(a) and 12(b) are explanatory views of a conventional dispenser coating method.
Figure 12B:
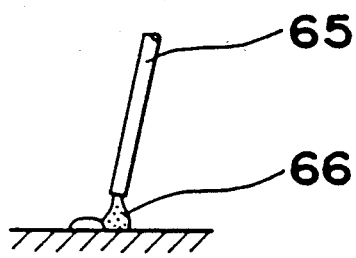

FIG. 10 is a schematic view of a coating material employed in the present invention, in which are shown an X axis 50, a Y axis 49, a Z axis 48, a θ driving motor 46, a nozzle 45 provided with a discharge portion 54, a rotary belt 47, a pressure feed pipe 55, a platform 51, an adhesion table 53 and an object to be coated 52.

As is described hereinabove, the present invention enables simultaneous coating in multiple rows or simultaneous coating in multiple rows with different shapes. Therefore, in comparison with the conventional screen printing, the present coating method is advantageous in that the surface to be coated can be smooth, with less stains left thereon, and moreover, no trouble for maintenance of the coating machine, for example, exchange of the coating material is necessary. Furthermore, the present invention is superior to the case using the dispenser in sealing efficiency and positioning convenience. The coating method according to the present invention is effectively useful to simultaneously coat different kinds of the coating materials in many rows. By the coating method of the present invention, the sintering process can be effected at one time.

Although the present invention has been fully described by way of example with reference to the accompanying drawings, it is to be noted here that various changes and modifications will be apparent to those skilled in the art. Therefore, unless other wise such changes and modifications depart from the scope of the present invention, they should be construed as included therein.

What is claimed is:

1. A method for simultaneously applying a coating of different viscous materials onto a substrate, comprising the steps of:

providing a single integrated nozzle body containing a plurality of tanks, each tank having a discharge outlet disposed on the bottom surface of the single integrated nozzle body in a predetermined positional relationship, and each tank containing a viscous material, wherein said discharge outlets are substantially parallel to the substrate, wherein said plurality of tanks contain at least two different viscous materials, and wherein the single integrated nozzle body is capable of simultaneously discharging the different viscous materials from their respective tanks through their respective discharge outlets onto a substrate in a predetermined pattern, moving the single integrated nozzle body above the surface of the substrate at a predetermined constant distance, and discharging the different viscous materials from the tanks through the discharge outlets onto the substrate continuously and simultaneously, wherein a plurality of different viscous materials are simultaneously applied to the surface of the substrate in a plurality of rows.

2. The coating method according to claim 1, wherein the nozzle is moved above the surface of the substrate at a predetermined constant distance by having integrally formed with the nozzle a gap member which slides on a surface in the vicinity of the surface of the substrate to be coated.

3. The coating method according to claim 1, wherein the shape of the surface of the substrate is detected by light to be fed back to a driving part which holds the nozzle so that the distance between the nozzle and the surface of the substrate to be coated is maintained at a predetermined constant distance.

4. The method according to claim 1, wherein the plurality of tanks comprise a first tank having a first discharge outlet and a second tank containing a second discharge outlet, wherein the first and second discharge outlets are slits positionally related such that the longitudinal axes of the discharge outlets are substantially parallel and non-overlapping, and wherein the longitudinal axes of the discharge outlets are perpendicular to the direction of movement of the single integrated nozzle body, such that when the single integrated nozzle body is moved above the surface of the substrate and the different viscous materials are discharged, two parallel rows of different viscous materials are simultaneously applied to the surface of the substrate in rows which are contiguous and non-overlapping.

5. The method according to claim 4, wherein the first tank contains an epoxy liquid and the second tank contains an ultra-violet ray hardening material.

6. The method according to claim 1, wherein the plurality of tanks comprise a first tank having a first discharge outlet, a second tank having a second discharge outlet, and a third tank having a third discharge outlet, wherein the first, second and third discharge outlets are slits, and wherein the first and second discharge outlets are positionally related such that the longitudinal axes of the discharge outlets are spaced apart in a line end-to-end, wherein the longitudinal axis of the third discharge outlet is substantially parallel and partially overlapping the first and second discharge outlets, and wherein the longitudinal axes of each discharge outlet are perpendicular to the direction of movement of the single integrated nozzle body, such that when the unitary nozzle body is moved above the surface of the substrate and the different viscous materials are discharged, three parallel rows of viscous materials are simultaneously applied to the surface of the substrate, and the rows of material discharged from the first and second discharge outlets partially overlap the row of material discharged from the third discharge outlet.

7. The method according to claim 6, wherein the first and second tanks contain an insulative material, and the third tank contains a conductive material.

8. The method according to claim 1, wherein the plurality of tanks comprise a first tank having a first discharge outlet and a second tank having a second discharge outlet, wherein the first and second discharge outlets are slits positionally related such that the longitudinal axes of the discharge outlets are spaced apart in a line end-to-end, and wherein the longitudinal axes of each discharge outlet are perpendicular to the direction of movement of the single integrated nozzle body, such that when the single integrated nozzle body is moved above the surface of the substrate discharging different viscous materials, two rows of different viscous materials are simultaneously applied to the surface of the substrate and mixed to form a single smooth row of the different viscous materials.

9. The method according to claim 8, wherein the first tank contains an epoxy liquid and the second tank contains an ultra-violet ray hardening material.

10. A method for simultaneously applying a coating of different viscous materials onto a substrate, comprising the steps of:
providing a single integrated nozzle body containing a plurality of tanks, each tank having a discharge outlet disposed on the bottom surface of the single integrated nozzle body in a predetermined positional relationship, and each tank containing a viscous material, wherein said discharge outlets are substantially parallel to the substrate, wherein said plurality of tanks contain at least two different viscous materials, and wherein the single integrated nozzle body is capable of simultaneously discharging the different viscous materials from their respective tanks through their respective discharge outlets onto a substrate in a predetermined pattern,
moving the single integrated nozzle body above the surface of the substrate at a predetermined constant distance, and
discharging at least one viscous material from at least one tank through at least one discharge outlet onto the substrate continuously while discharging at least one other different viscous material from at least one other tank through at least one other discharge outlet intermittently,
wherein a plurality of different viscous materials are simultaneously applied to the surface of the substrate in a plurality of rows.

11. The coating method according to claim 10, wherein the nozzle is moved above the surface of the substrate at a predetermined constant distance by having integrally formed with the nozzle a gap member which slides on a surface in the vicinity of the surface of the substrate to be coated.

12. The coating method according to claim 10, wherein the shape of the surface of the substrate is detected by light to be fed back to a driving part which holds the nozzle so that the distance between the nozzle and the surface of the substrate to be coated is maintained at a predetermined constant distance.

13. The coating method according to claim 10, wherein at least one viscous material is discharged from at least one outlet of the nozzle at a distance above the surface of the substrate which is different from at least one other outlet for discharging at least one other viscous material therefrom.

14. The method according to claim 10, wherein the plurality of tanks comprise a first tank having a first discharge outlet and a second tank containing a second discharge outlet, wherein the first and second discharge outlets are slits positionally related such that the longitudinal axes of the discharge outlets are substantially parallel and non-overlapping, and wherein the longitudinal axes of the discharge outlets are perpendicular to the direction of movement of the single integrated nozzle body, such that when the single integrated nozzle body is moved above the surface of the substrate and the different viscous materials are discharged, two parallel rows of different viscous materials are simultaneously applied to the surface of the substrate in rows which are contiguous and non-overlapping.

15. The method according to claim 14, wherein the first tank contains an epoxy liquid and the second tank contains an ultra-violet ray hardening material.

16. The method according to claim 10, wherein the plurality of tanks comprise a first tank having a first discharge outlet, a second tank having a second discharge outlet, and a third tank having a third discharge outlet, wherein the first, second and third discharge outlets are slits, and wherein the first and second discharge outlets are positionally related such that the longitudinal axes of the discharge outlets are spaced apart in a line end-to-end, wherein the longitudinal axis of the third discharge outlet is substantially parallel and partially overlapping the first and second discharge outlets, and wherein the longitudinal axes of each discharge outlet are perpendicular to the direction of movement of the single integrated nozzle body, such that when the unitary nozzle body is moved above the surface of the substrate and the different viscous materials are discharged, three parallel rows of viscous materials are simultaneously applied to the surface of the substrate, and the rows of material discharged from the first and second discharge outlets partially overlap the row of material discharged from the third discharge outlet.

17. The method according to claim 16, wherein the first and second tanks contain an insulative material, and the third tank contains a conductive material.

18. The method according to claim 10, wherein the plurality of tanks comprise a first tank having a first discharge outlet and a second tank having a second discharge outlet, wherein the first and second discharge outlets are slits positionally related such that the longitudinal axes of the discharge outlets are spaced apart in a line end-to-end, and wherein the longitudinal axes of each discharge outlet are perpendicular to the direction of movement of the single integrated nozzle body, such that when the single integrated nozzle body is moved above the surface of the substrate discharging different viscous materials, two rows of different viscous materials are simultaneously applied to the surface of the substrate and mixed to form a single smooth row of the different viscous materials.

19. The method according to claim 18, wherein the first tank contains an epoxy liquid and the second tank contains an ultra-violet ray hardening material.

20. A method for simultaneously applying a coating of different viscous materials onto a substrate, comprising the steps of:

providing a single integrated nozzle body containing a plurality of tanks, each tank having a discharge outlet disposed on the bottom surface of the single integrated nozzle body in a predetermined positional relationship, and each tank containing a viscous material, wherein said plurality of tanks contain at least two different viscous materials, wherein said discharge outlets are substantially parallel to the substrate, wherein at least one viscous material is capable of being discharged from at least one discharge outlet at a different distance above the surface of the substrate than at least one other different viscous material discharged from at least one other discharge outlet, and wherein the single integrated nozzle body is capable of simultaneously discharging the different viscous materials from their respective tanks through their respective discharge outlets onto a substrate in a predetermined pattern, moving the single integrated nozzle body above the surface of the substrate at a predetermined constant distance, and discharging the different viscous materials from the tanks through the discharge outlets onto the substrate continuously and simultaneously, wherein a plurality of different viscous materials are simultaneously applied to the surface of the substrate in a plurality of rows.

21. The coating method according to claim 20, wherein the nozzle is moved above the surface of the substrate at a predetermined constant distance by having integrally formed with the nozzle a gap member which slides on a surface in the vicinity of the surface of the substrate to be coated.

22. The coating method according to claim 20, wherein the shape of the surface of the substrate is detected by light to be fed back to a driving part which holds the nozzle so that the distance between the nozzle and the surface of the substrate to be wasted is maintained at a predetermined constant distance.

23. The method according to claim 20, wherein the plurality of tanks comprise a first tank having a first discharge outlet and a second tank containing a second discharge outlet, wherein the first and second discharge outlets are slits positionally related such that the longitudinal axes of the discharge outlets are substantially parallel and non-overlapping, and wherein the longitudinal axes of the discharge outlets are perpendicular to the direction of movement of the single integrated nozzle body, such that when the single integrated nozzle body is moved above the surface of the substrate and the different viscous materials are discharged, two parallel rows of different viscous materials are simultaneously applied to the surface of the substrate in rows which are contiguous and non-overlapping.

24. The method according to claim 23, wherein the first tank contains an epoxy liquid and the second tank contains an ultra-violet ray hardening material.

25. The method according to claim 20, wherein the plurality of tanks comprise a first tank having a first discharge outlet, a second tank having a second discharge outlet, and a third tank having a third discharge outlet, wherein the first, second and third discharge outlets are slits, and wherein the first and second discharge outlets are positionally related such that the longitudinal axes of the discharge outlets are spaced apart in a line end-to-end, wherein the longitudinal axis of the third discharge outlet is substantially parallel and partially overlapping the first and second discharge outlets, and wherein the longitudinal axes of each discharge outlet are perpendicular to the direction of movement of the single integrated nozzle body, such that when the unitary nozzle body is moved above the surface of the substrate and the different viscous materials are discharged, three parallel rows of viscous materials are simultaneously applied to the surface of the substrate, and the rows of material discharged from the first and second discharge outlets partially overlap the row of material discharged from the third discharge outlet.

26. The method according to claim 25, wherein the first and second tanks contain an insulative material, and the third tank contains a conductive material.

27. The method according to claim 20, wherein the plurality of tanks comprise a first tank having a first discharge outlet and a second tank having a second discharge outlet, wherein the first and second discharge outlets are slits positionally related such that the longitudinal axes of the discharge outlets are spaced apart in a line end-to-end, and wherein the longitudinal axes of each discharge outlet are perpendicular to the direction of movement of the single integrated nozzle body, such that when the single integrated nozzle body is moved above the surface of the substrate discharging different viscous materials, two rows of different viscous materials are simultaneously applied to the surface of the substrate and mixed to form a single smooth row of the different viscous materials.

28. The method according to claim 27, wherein the first tank contains an epoxy liquid and the second tank contains an ultra-violet ray hardening material.

* * * * *